(12) United States Patent
Akiba et al.

(10) Patent No.: US 9,293,436 B2
(45) Date of Patent: Mar. 22, 2016

(54) BONDING WIRE TO BONDING PAD

(71) Applicant: RENESAS ELECTRONICS CORPORATION, Kawasaki-shi, Kanagawa (JP)

(72) Inventors: Toshihiko Akiba, Kanagawa (JP); Akihiro Tobita, Kanagawa (JP); Yuki Yagyu, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/711,014

(22) Filed: May 13, 2015

(65) Prior Publication Data

US 2015/0333030 A1 Nov. 19, 2015

(30) Foreign Application Priority Data

May 14, 2014 (JP) ................................ 2014-100434

(51) Int. Cl.
*H01L 21/44* (2006.01)
*H01L 23/48* (2006.01)
*H01L 23/00* (2006.01)
*H01L 21/48* (2006.01)

(52) U.S. Cl.
CPC ............ *H01L 24/43* (2013.01); *H01L 21/4885* (2013.01); *H01L 24/05* (2013.01); *H01L 24/48* (2013.01); *H01L 24/85* (2013.01); *H01L 2224/16012* (2013.01); *H01L 2224/48257* (2013.01); *H01L 2924/013* (2013.01); *H01L 2924/15311* (2013.01)

(58) Field of Classification Search
CPC ..................... H01L 2224/48257; H01L 24/06; H01L 24/49; H01L 24/85; H01L 24/43; H01L 2/48; H01L 24/05; H01L 21/4885; H01L 2224/16012; H01L 2224/482574
See application file for complete search history.

(56) References Cited

U.S. PATENT DOCUMENTS

| 8,063,489 B2 | 11/2011 | Shigihara et al. | |
|---|---|---|---|
| 2002/0135947 A1* | 9/2002 | Aoki | H01L 43/08 360/322 |
| 2009/0081875 A1* | 3/2009 | Ruffler | H01L 21/02068 438/706 |
| 2014/0284790 A1* | 9/2014 | Matsumoto | H01L 22/32 257/737 |

FOREIGN PATENT DOCUMENTS

| JP | 2010-157683 A | 7/2010 |
|---|---|---|
| JP | 2013-118310 A | 6/2013 |

* cited by examiner

*Primary Examiner* — Alonzo Chambliss
(74) *Attorney, Agent, or Firm* — McDermott Will & Emery LLP

(57) ABSTRACT

A manufacturing method of a BGA, includes the steps of: providing a semiconductor chip having electrode pads; and removing a natural oxide film formed on the surface of each of the electrode pads. Further, a first film comprised of a conductive member is formed on the surface of the electrode pad exposed by removing the natural oxide film, a wire is connected with the first film, and part of the wire is brought into contact with the electrode pad to form an alloy layer at the interface between the wire and the electrode pad. The crystal structure of the first film is comprised of a body-centered cubic lattice or a hexagonal close-packed lattice. The cost of the semiconductor device can be reduced while the bonding reliability of wire bonding of the semiconductor device is ensured.

9 Claims, 17 Drawing Sheets

BONDING WIRE TO BONDING PAD

CROSS-REFERENCE TO RELATED APPLICATIONS

The disclosure of Japanese Patent Application No. 2014-100434 filed on May 14, 2014 including the specification, drawings and abstract is incorporated herein by reference in its entirety.

BACKGROUND

The present invention relates to a manufacturing method of a semiconductor device and a semiconductor device, for example, an effective technology applied to a semiconductor device, in which wire bonding is carried out.

RELATED ART

Out of semiconductor devices including bonding wires (to be simply referred to as "wires" hereinafter), the structure of a semiconductor device including wires which contain copper as the main component is disclosed in Japanese Patent Unexamined Patent Application Publication No. 2013-118310 (Patent Document 1) and Japanese Patent Unexamined Patent Application Publication No. 2010-157683 (Patent Document 2).

RELATED ART DOCUMENTS

Patent Documents

Patent Document 1

Japanese Patent Unexamined Patent Application Publication No. 2013-118310

Patent Document 2

Japanese Patent Unexamined Patent Application Publication No. 2010-157683

SUMMARY

To cut the cost of a semiconductor device including wires, it is considered effective that, instead of wires made of gold (Au), wires made of a conductive material except for gold is used.

However, when a natural oxide film is formed on the surface s of the electrode pads of a semiconductor chip, if wires made of a conductive material except for gold are used, a bonding failure may occur between the wires and the electrode pads.

There is a method in which a conductive film made of gold is formed on the surfaces of the electrode pads of a semiconductor chip and wires are electrically connected with the electrode pads through this conductive film. This conductive film is, for example, a plating film, an OPM (Over Pad Metallization) film or an UBM (Under Bump Metallization) film. However, in the case of the above method, since gold is used as the material of the conductive film, it is not preferred from the viewpoint of reducing the cost of a semiconductor device.

Then, the inventors of the present application investigated a technology capable of reducing the cost of a semiconductor device while ensuring the bonding reliability of wires.

Other objects and novel features will become apparent from the description of this specification and the accompanying drawings.

A manufacturing method of a semiconductor device according to an embodiment of the invention includes the steps of:

(a) providing a semiconductor chip including an electrode pad;

(b) after the step (a), removing a natural oxide film formed on the surface of the electrode pad; and (c) after the step (b), forming a pad-cover film, comprised of a conductive member, over the surface of the electrode pad exposed by removing the natural oxide film.

The method further includes:

(d) after the step (c), connecting a part of wire, comprised of a conductive material containing no gold, with the pad-cover film, and forming an alloy layer at the interface between the wire and the electrode pad, the crystal structure of the pad-cover film being comprised of one of a body-centered cubic lattice and a hexagonal close-packed lattice.

A semiconductor device according to an embodiment of the invention includes a semiconductor chip including a plurality of electrode pads formed on the main surface, a plurality of leads, and a plurality of wires, comprised of a conductive material containing no gold, electrically connecting the electrode pads with the leads, respectively, in which a plurality of pad-cover films, comprised of a conductive member, are formed on the surfaces of the plurality of electrode pads, respectively, and the plurality of wires are connected with the electrode pads such that alloy layers are formed at the interfaces with the plurality of wires and the plurality of electrode pads, respectively. Further, in the semiconductor device, the above plurality of pad-cover films are arranged around connecting parts of the plurality of wires in the surfaces of the plurality of electrode pads, respectively, and the crystal structure of each of the pad-cover films is comprised of one of a body-centered cubic lattice and a hexagonal close-packed lattice.

According to the above embodiment, the cost of the semiconductor device can be reduced while the bonding reliability of wire bonding in the semiconductor device is ensured.

DETAILED DESCRIPTION

In the following embodiment, a description of the same or similar part is not repeated in principle unless it is particularly necessary.

Further, the following embodiment is explained by dividing into a plurality of sections or embodiments when it is necessary for convenience sake. Unless it is clearly stated, they are not unrelated to each other, and one is a modification, details or supplementary explanation of part or all of the other.

In the following embodiment, when the number of elements (including number, numerical value, quantity, range, etc.) is mentioned, it is not limited to a specific number and may be more or less than the specific number unless it is clearly specified or apparently limited to the specific number in principle.

In the following embodiment, it is needless to say that the constituent elements (including element steps, etc.) are not always essential unless it is clearly stated and they are apparently considered as essential in principle.

In the following embodiment, when expressions such as "comprising A", "comprised of A", "having A" and "including A" are used for the constituent element, etc., it is needless to say that other elements are not excluded unless it is clearly stated that the constituent element is the only element. Similarly, in the following embodiment, when the shape or positional relationship of the constituent element is mentioned, it includes a shape or position substantially close or similar to that shape or position unless it is clearly stated and it is considered that it is apparently that shape or position in principle. This can be said of the above numerical value and range.

An embodiment of the present invention will be described in detail hereinunder with reference to the accompanying drawings. In all the drawings for explaining the embodiment, the same reference symbols are given to members having the same function and a repeated explanation thereof is omitted. Even a plan view may be hatched in order to make it easily understandable.

Figure 1:
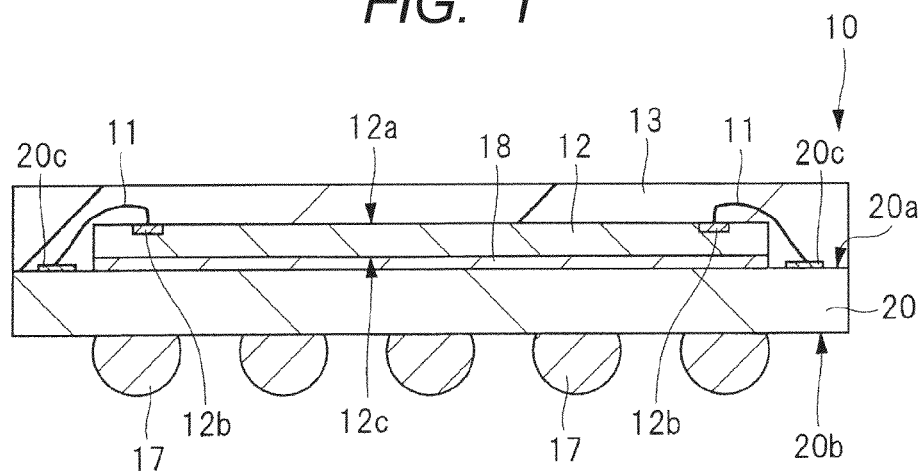
FIG. 1 is a sectional view showing an example of the structure of a semiconductor device (BGA) according to an embodiment of the present invention.
Figure 2:
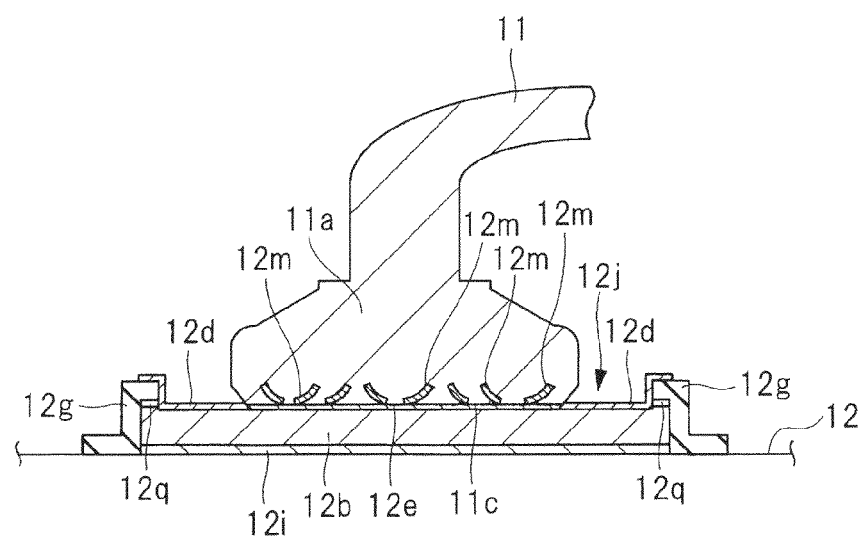
FIG. 2 is a partially enlarged sectional view showing an example of the structure of the wire bonding part of the semiconductor device shown in FIG. 1.
Figure 3:
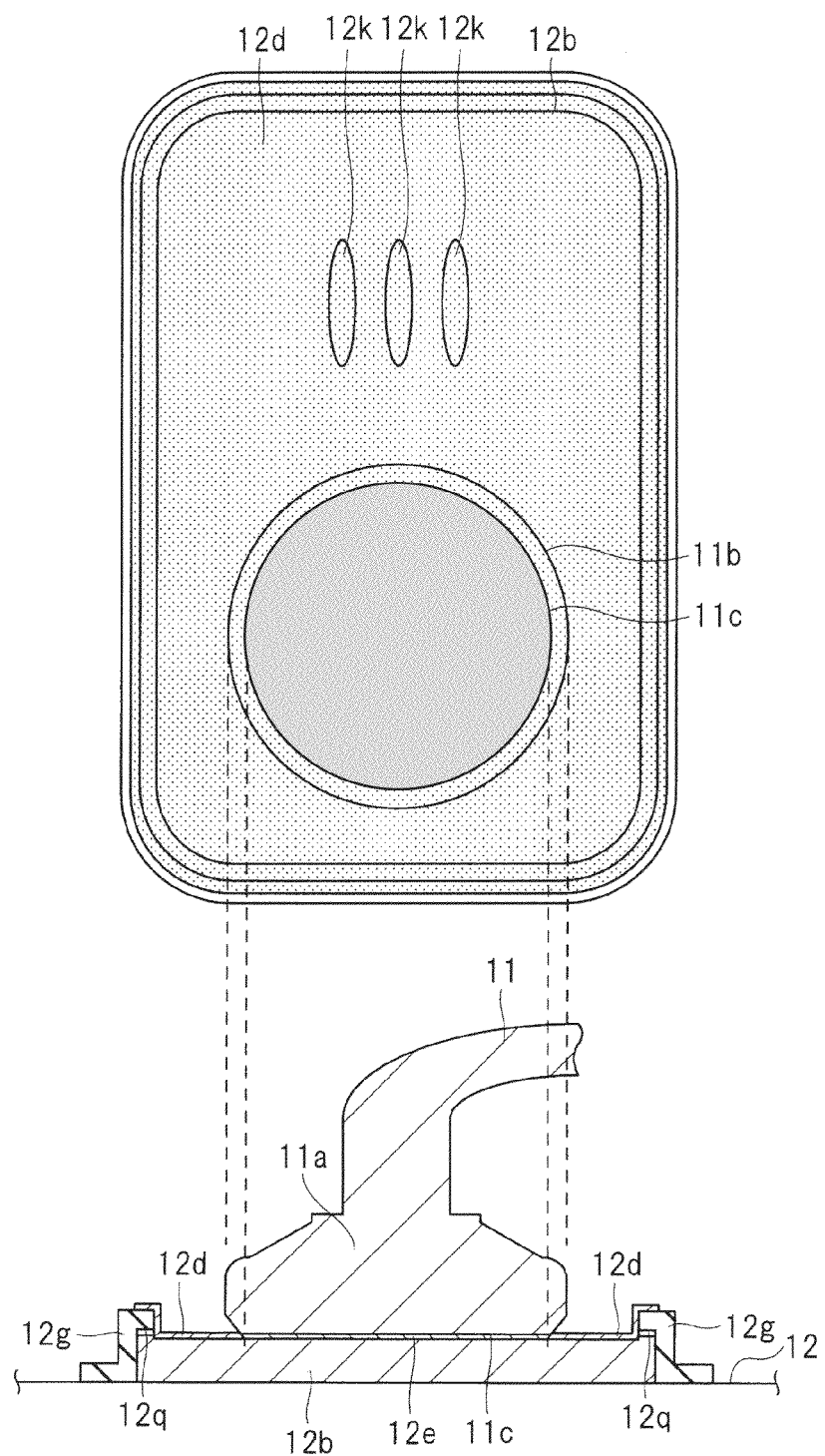
FIG. 3 include a plan view and a partial sectional view showing an example of the structure of the wire bonding part shown in FIG. 2.

(Embodiment) FIG. 1 is a sectional view showing an example of the structure of a semiconductor device (BGA) according to the embodiment, FIG. 2 is a partially enlarged sectional view showing an example of the structure of the wire bonding part of the semiconductor device shown in FIG. 1, and FIG. 3 includes a plan view and a partial sectional view showing an example of the structure of the wire bonding part shown in FIG. 2.

<Semiconductor Device> The semiconductor device according to this embodiment shown in FIG. 1 is a semiconductor package in which a semiconductor chip 12 mounted over the top surface 20a of a package substrate 20 which is a wiring board is resin-sealed with a sealing body 13 and electrically connected with the bonding leads (leads) 20c of the package substrate 20 by wires 11.

In this embodiment, a BGA (Ball Grid Array) 10 having a plurality of solder bumps (solder balls) 17 which will become external connection terminals in a grid (lattice) pattern over the under surface 20b of the package substrate 20 is taken as an example of the above semiconductor device. The solder bumps 17 may be provided, for example, along the periphery of the under surface 20b of the package substrate 20.

Describing the detailed constitution of the BGA 10, the BGA 10 has the package substrate (may also be referred to as "BGA substrate") 20 including the top surface 20a, the bonding leads 20c which are connection terminals formed over the top surface 20a, and the under surface (rear surface, mounting surface) 20b opposite to the top surface 20a.

The BGA 10 further has the semiconductor chip 12 mounted over the top surface 20a of the package substrate 20, the wires 11 electrically connecting the bonding leads 20c of the package substrate 20 with electrode pads 12b exposed to the main surface 12a of the semiconductor chip 12, respectively, and the solder bumps 17 which are external connection terminals and provided over the under surface 20b of the package substrate 20.

The semiconductor chip 12 mounted over the package substrate 20 has the electrode pads 12b which are bonding pads in such a manner that they are exposed to the main surface 12a.

Over the top surface 20a of the package substrate 20, the bonding leads 20c are arranged around the semiconductor chip 12, and the electrode pads 12b exposed to the main surface 12a of the semiconductor chip 12 and the bonding leads 20c are electrically connected with each other by the respective wires 11.

As described above, the BGA 10 is a substrate type semiconductor package in which the semiconductor chip 12 is mounted over the package substrate 20 and connected with the package substrate 20 by the wires and the semiconductor chip 12 and the wires 11 are sealed with the sealing body 13 formed from a resin.

The semiconductor chip 12 has the main surface 12a and a rear surface 12c which is opposite to the main surface 12a, arranged opposed to the top surface 20a of the package substrate 20 and fixed to the top surface 20a of the package substrate 20 by a die bonding material 18 such as a resin paste material.

Herein, the semiconductor chip 12 is formed from, for example, silicon, and the electrode pads 12b are formed from a material containing aluminum (Al) as the main component. Further, the wires 11 are formed from a material containing copper (Cu) as the main component. The sealing resin for forming the sealing body 13 is, for example, a thermosetting epoxy resin. The external connection terminals of the BGA 10 are solder bumps 17 formed from a solder material such as Sn—Pb-based solder or Pb-free solder, out of which Pb-free solder is preferably used.

The package substrate 20 is a resin substrate to which, for example, a plurality of wiring layers and a plurality of insulating layers are formed on a core material such as a glass epoxy resin.

Thus, from the electrode pads 12b of the semiconductor chip 12 to the solder bumps 17 which are the external connection terminals of the BGA 10 are electrically connected through the wires 11, the bonding leads 20c and unshown via holes and bump lands.

A description is subsequently given of the structures of the electrode pad 12b of the semiconductor chip 12 and the wire bonding part 11a of the BGA 10 according to this embodiment with reference to FIG. 2 and FIG. 3.

In the BGA 10, a first film (pad-cover film) 12d composed of a conductive member is formed on the surface of the electrode pad 12b of the semiconductor chip 12.

Herein, the electrode pad 12b of the semiconductor chip 12 is formed in such a manner that it is exposed to the main surface 12a of the semiconductor chip 12. That is, the electrode pad 12b is exposed to the opening 12j of a passivation film 12g which is an insulating film (protection film) made of, for example, S1O.

In this embodiment, a case where the electrode pad 12b is made of aluminum (Al) will be explained.

A metal film such as a Ti/TiN/Ti film 12i is formed below the electrode pad 12b made of aluminum.

As shown in FIG. 2, the first film (pad-cover film) 12d is formed on the surface of the electrode pad 12b. This first film 12d is comprised of a conductive member such as a chromium or tungsten member and connected with the electrode pad 12b in such a manner that the wire 11 breaks the first film 12d.

That is, in the semiconductor chip 12 of this embodiment, a natural oxide film 12f shown in FIG. 11 which is formed by making an opening in the passivation film 12g when the electrode pad 12b is formed and described hereinafter is first removed to expose the pure aluminum surface of the electrode pad 12b, and then the first film 12d which is stable as a pad-cover film is formed over this pure aluminum surface. Then, the first film 12d is broken (destroyed) by the wire 11 at the time of wire bonding.

Therefore, a plurality of broken pieces 12m of the broken first film 12d remain in the vicinity of the bonding surface 11c of the wire bonding part 11a. At the time of wire bonding, part of the wire 11 which is a copper wire breaks the first film 12d and contacts the pure aluminum electrode pad 12b, thereby forming an alloy layer 12e at the interface between the wire 11 and the electrode pad 12b. That is, Cu of the wire 11 and Al of the electrode pad 12b react with each other to form a Cu/Al layer as the alloy layer 12e.

The first film 12d is located around the connecting part (wire bonding part 11a) to the electrode pad 12b of the wire 11 over the surface of the electrode pad 12b. In this embodiment, as shown in the plan view of FIG. 3, the first film 12d is formed over the entire surface of the electrode pad 12b. That is, the first film 12d is formed to cover the entire surface of the electrode pad 12b.

At this point, as shown in the sectional view of FIG. 3, the first film 12d is formed up to an area where it contacts the bonding surface 11c of the wire bonding part 11a. As shown in the plan view of FIG. 3, when looking at the electrode pad 12b from above, the first film 12d enters the inner side of the wire 11 from the ball diameter 11b.

As shown in the plan view of FIG. 3, in an area away from the wire bonding part 11a of the surface of the electrode pad 12b, a plurality of probe marks 12k are formed by probe testing and covered by the first film 12d.

A description is subsequently given of a condition for the first film 12d which is formed on the surface of the electrode pad 12b of the semiconductor chip 12.

The first film 12d is preferably comprised of a conductive member (conductive material) and a low-resistance film. Further, it preferably has a large hardness difference from Al and Cu so that it is easily broken (easily fractured). That is, when the wire 11 is pressed by the load of wire bonding at the time of wire bonding, the first film 12d is broken to stably bond the wire 11 to the pure Al of the electrode pad 12b.

At this point, the first film 12d is preferably broken but does not always need to be broken.

A description is subsequently given of the crystal structure of the first film 12d.

Figure 4:
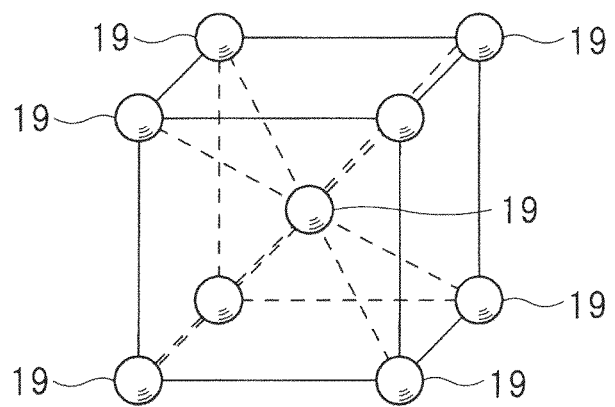
FIG. 4 is a perspective view showing an example of the crystal structure of the first film of the semiconductor device shown in FIG. 1.
Figure 5:
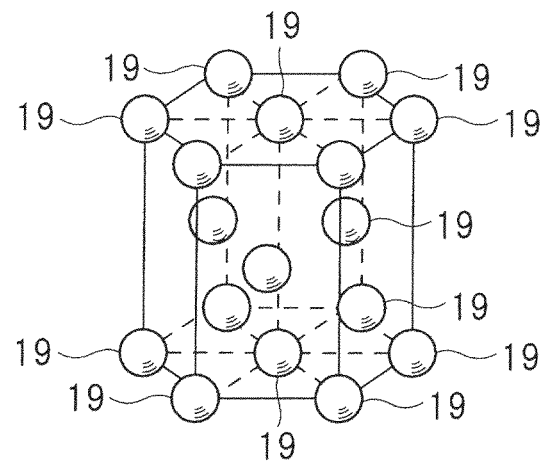
FIG. 5 is a perspective view showing an example of the crystal structure of the first film of the semiconductor device shown in FIG. 1.
Figure 6:
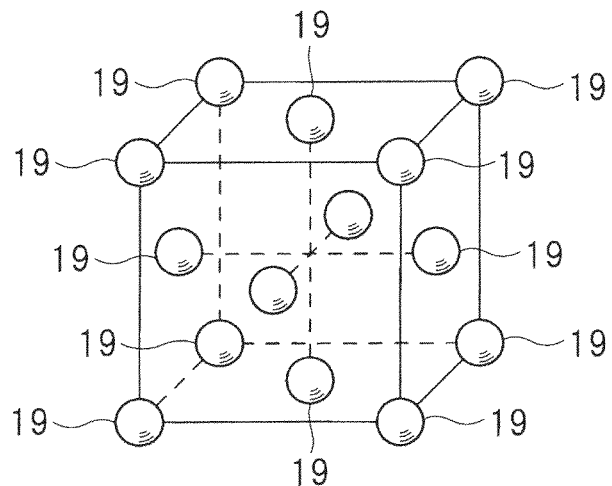
FIG. 6 is a perspective view showing the crystal structure of the material of Comparative Example.

FIG. 4 is a perspective view showing an example of the crystal structure (body-centered cubic lattice) of the first film of the semiconductor device shown in FIG. 1, FIG. 5 is a perspective view showing an example of the crystal structure (hexagonal close-packed lattice) of the first film of the semiconductor device shown in FIG. 1, and FIG. 6 is a perspective view showing the crystal structure (face-centered cubic lattice) of the material of Comparative Example.

In the body-centered cubic lattice structure shown in FIG. 4, atoms 19 are situated at the apexes and the center of a cubic unit lattice. In the hexagonal close-packed lattice structure shown in FIG. 5, the atoms 19 are existent at the apexes of the top surface and the bottom surface of a regular hexagonal column and three atoms 19 are existent at a height ½ of the total height of the regular hexagonal column. Further, in the face-centered cubic lattice structure of Comparative Example of FIG. 6, the atoms 19 are situated at the apexes and the centers of the faces of a unit lattice.

Al and Cu have a face-centered cubic lattice structure. Therefore, a crystal structure having a large hardness difference from Al and Cu so that it is easily broken is a condition required for the first film 12d with the result that the crystal structure of the first film 12d of this embodiment is comprised of a body-centered cubic lattice or a hexagonal close-packed lattice.

Herein, examples of the material comprised of a body-centered cubic lattice used in the first film 12d include lithium (Li), sodium (Na), potassium (k), vanadium (V), chromium (Cr), iron (Fe), rubidium (Rb), niobium (Nb), molybdenum (Mo), barium (Ba), tantalum (Ta), tungsten (W) and europium (Eu).

Examples of the material comprised of a hexagonal close-packed lattice used in the first film 12d include beryllium (Be), magnesium (Mg), scandium (Sc), titanium (Ti), titanium nitride (TiN), cobalt (Co), zinc (Zn), yttrium (Y), zirconium (Zr), technetium (Tc), ruthenium (Ru) and gadolinium (Gd). Further, examples of the material comprised of a hexagonal close-packed lattice used in the first film 12d include terbium (Tb), dysprosium (Dy), holmium (Ho), erbium (Er), thulium (Tm), hafnium (Hf), rhenium (Re) and osmium (Os).

When the first film (pad-cover film) 12d is expressed by another definition, it is made of a passive metal (valve metal). The term "passive" means a state in which an oxide film resisting a corrosion function is formed on the surface of a metal, and the term "passive metal" means a metal which tends to become passive. That is, the passive metal is a metal which has a stable surface, is hardly oxidized and can keep bonding strength, such as chromium, titanium or tungsten.

As understood from above, the material of the first film (pad-cover film) 12d is preferably chromium, titanium or tungsten when breaking ease is taken into account and most preferably chromium from the viewpoint of corrosion resistance.

Chromium hardly diffuses even at a high temperature. Chromium hardly produces Kerkendall voids which are voids formed by a diffusion phenomenon. Therefore, the first film 12d in this embodiment is most preferably a chromium film.

A description is subsequently given of the assembly of the semiconductor device of this embodiment.

Figure 7:
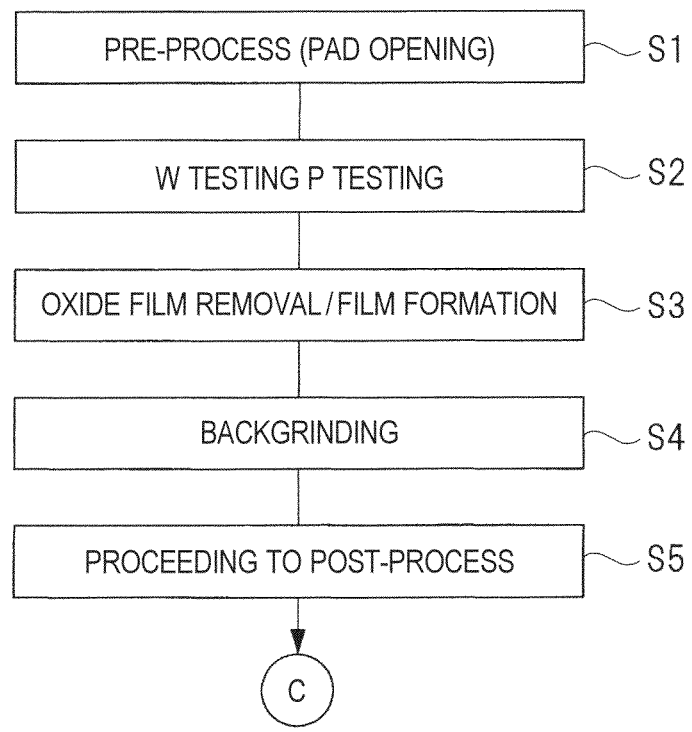
FIG. 7 is a flow chart showing an example of the pre-process of the assembly of the semiconductor device shown in FIG. 1.
Figure 8:
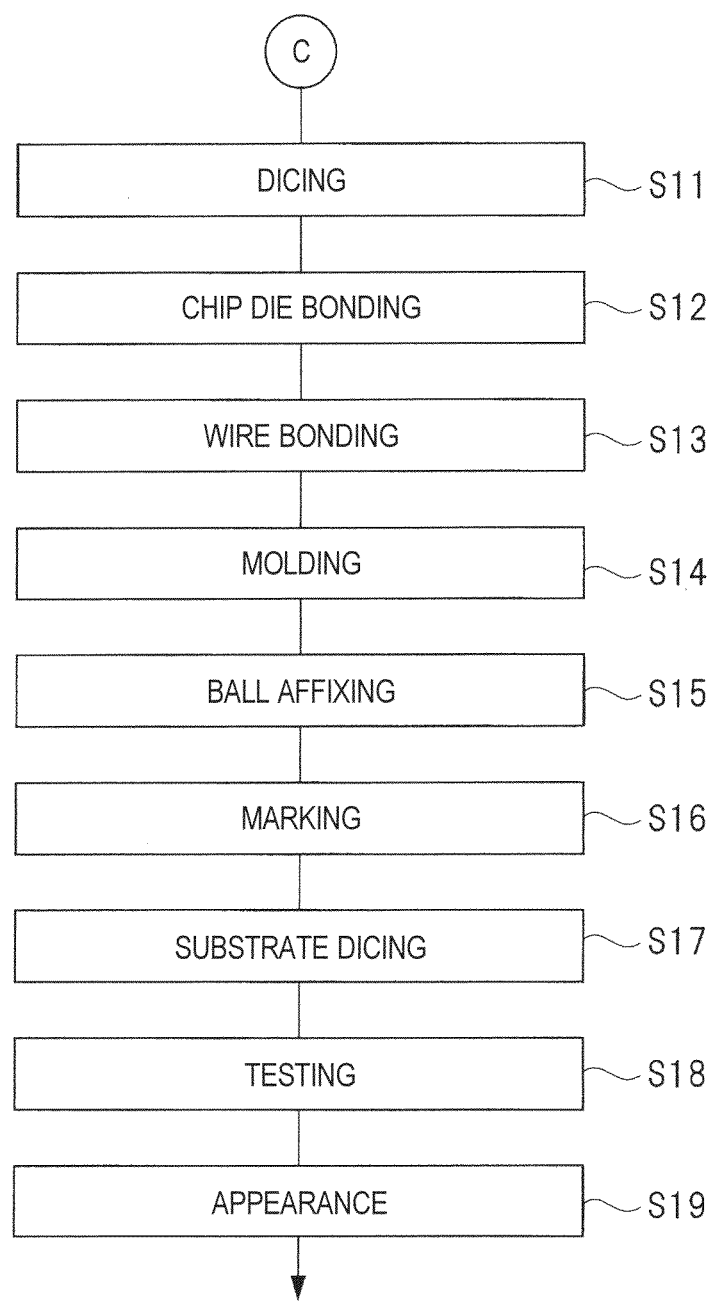
FIG. 8 is a flow chart showing an example of the post-process of the assembly of the semiconductor device shown in FIG. 1.
Figure 9:
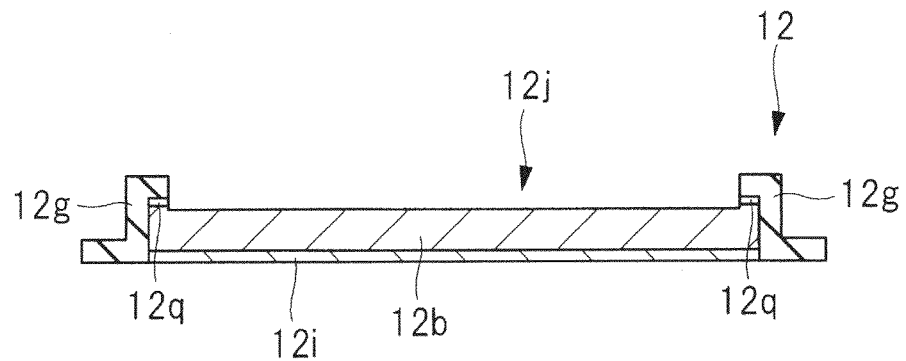
FIG. 9 is a sectional view showing an example of the structure after the pad opening of the pre-process shown in FIG. 7.
Figure 10:
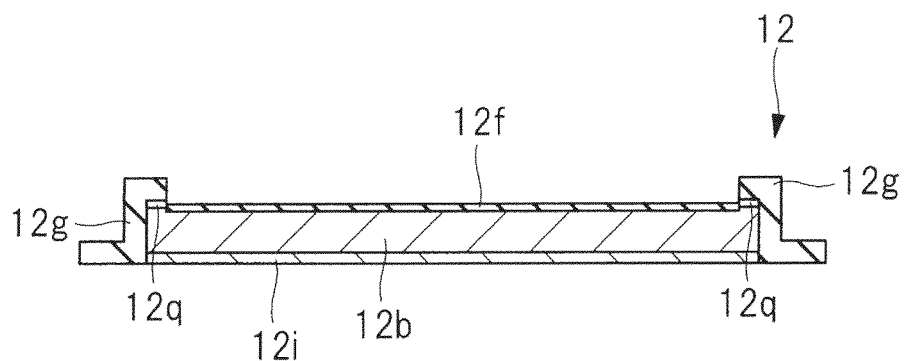
FIG. 10 is a sectional view showing an example of a natural oxide film forming state in the pre-process shown in FIG. 7.

FIG. 7 is a flow chart showing an example of the pre-process (method for manufacturing a semiconductor chip) of the assembly of the semiconductor device shown in FIG. 1, and FIG. 8 is a flow chart showing an example of the post-process (method for manufacturing BGA) of the assembly of the semiconductor device shown in FIG. 1. FIGS. 9 to 16 show a method for manufacturing a semiconductor chip. FIG. 9 is a sectional view showing an example of the structure after pad opening in the pre-process shown in FIG. 7, FIG. 10 is a sectional view showing an example of a natural oxide film forming state in the pre-process shown in FIG. 7, FIG. 11 is a sectional view showing an example of the structure after probe testing in the pre-process shown in FIG. 7, and FIG. 12 is a sectional view showing an example of a natural oxide film removal state in the pre-process shown in FIG. 7.

Figure 13:
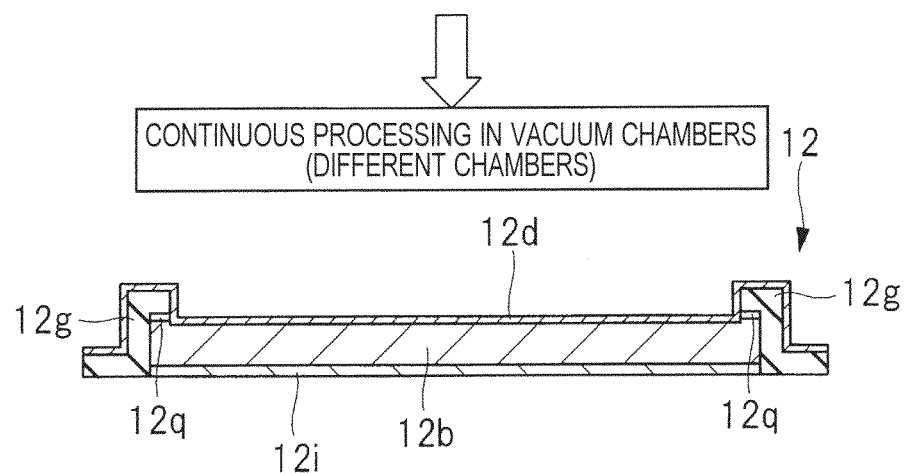
FIG. 13 is a sectional view showing an example of the structure after the formation of the first film in the pre-process shown in FIG. 7.
Figure 14:
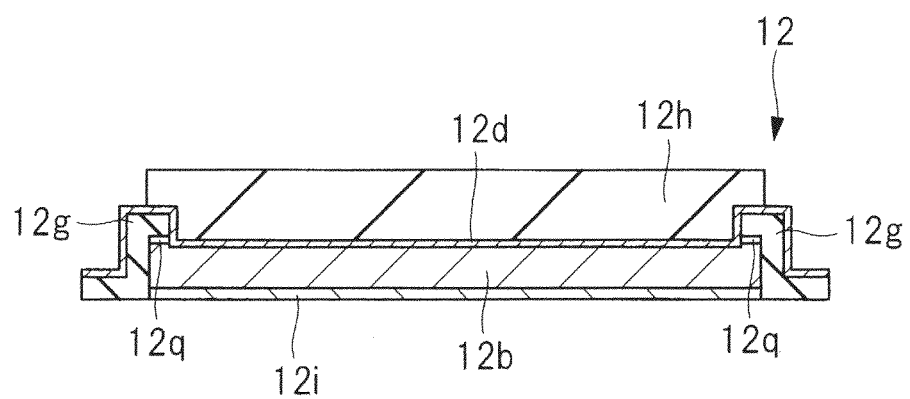
FIG. 14 is a sectional view showing an example of a photoresist forming state in the pre-process shown in FIG. 7.
Figure 15:
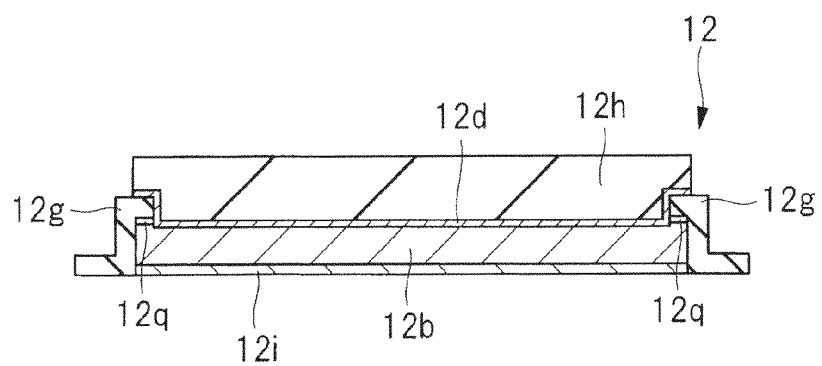
FIG. 15 is a sectional view showing an example of the structure after the removal of the first film in the pre-process shown in FIG. 7.
Figure 16:
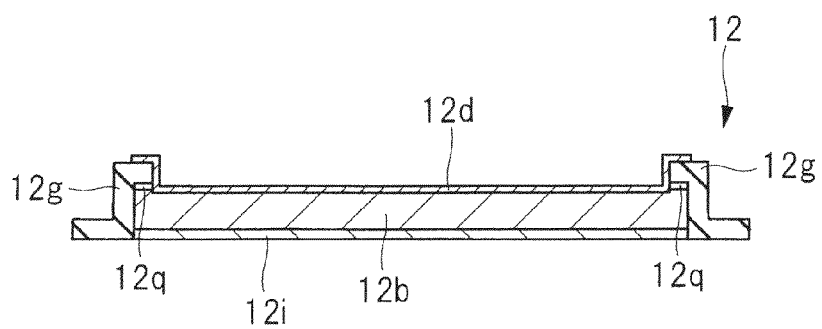
FIG. 16 is a sectional view showing an example of a photoresist removal state in the pre-process shown in FIG. 7.

Further, FIG. 13 is a sectional view showing an example of the structure after the formation of the first film in the pre-process shown in FIG. 7, FIG. 14 is a sectional view showing an example of a photoresist forming state in the pre-process shown in FIG. 7, FIG. 15 is a sectional view showing an example of the structure after the removal of the first film in the pre-process shown in FIG. 7, and FIG. 16 is a sectional view showing an example of a photoresist removal state in the pre-process shown in FIG. 7.

Figure 17:
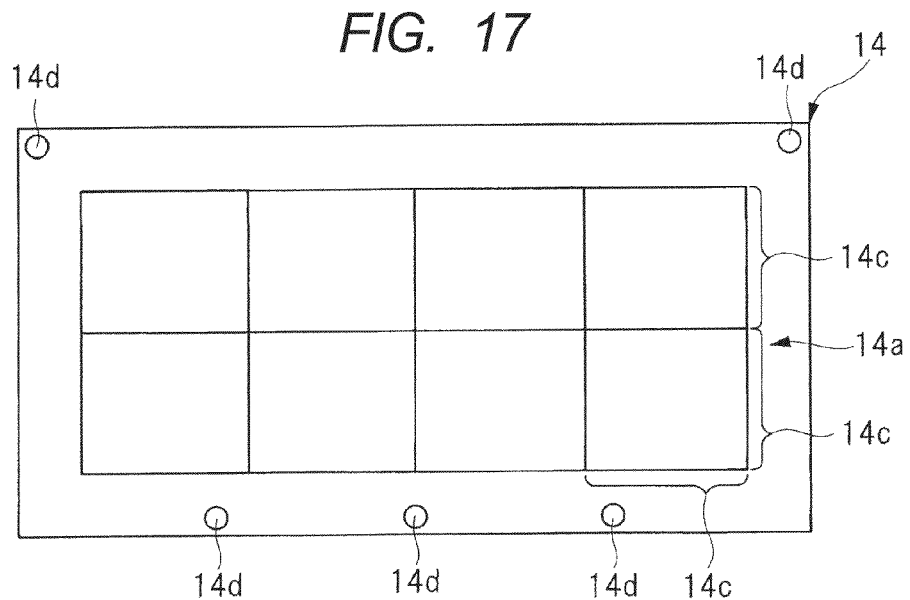
FIG. 17 is a plan view showing an example of the structure of a substrate used in the post-process shown in FIG. 8.
Figure 18:
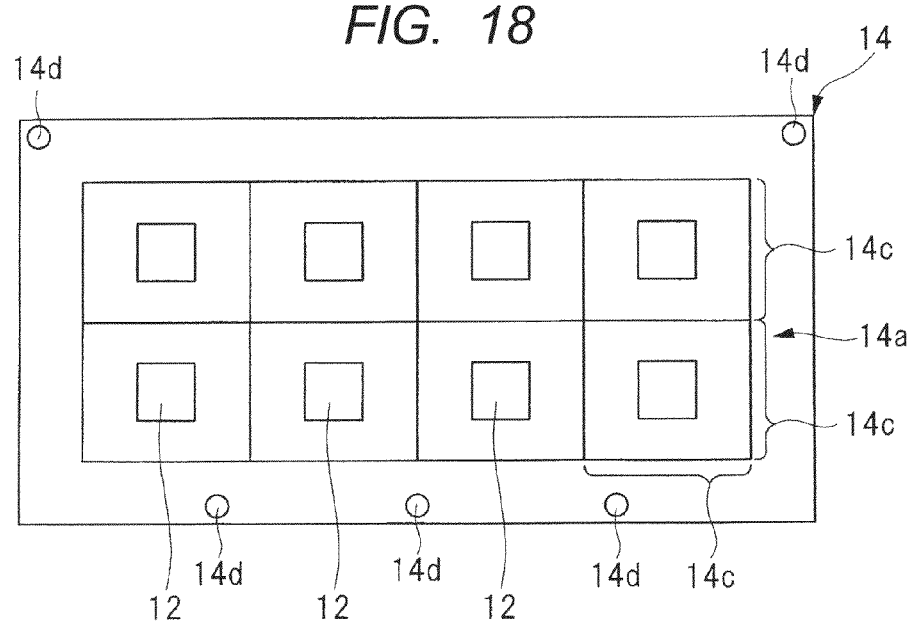
FIG. 18 is a plan view showing an example of the structure after chip die bonding in the post-process shown in FIG. 8.
Figure 19:
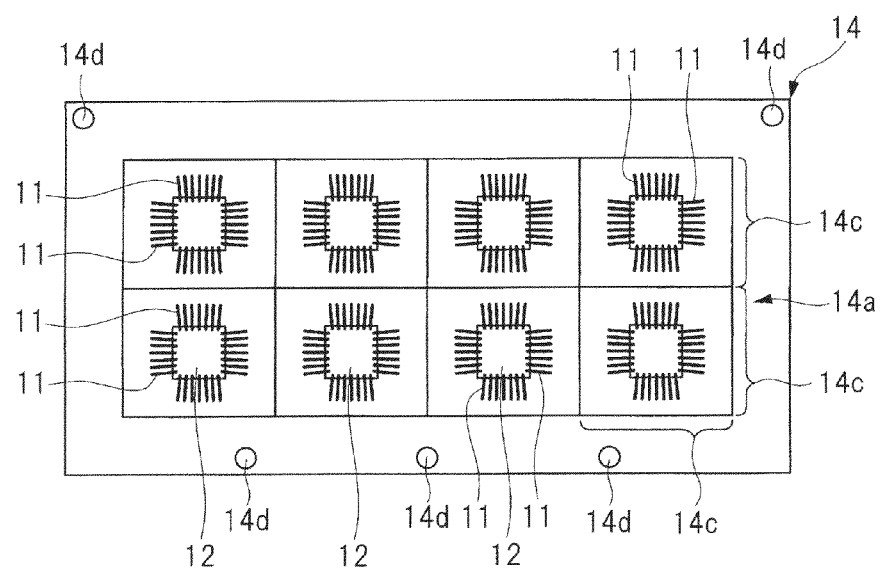
FIG. 19 is a plan view showing an example of the structure after wire bonding in the post-process shown in FIG. 8.
Figure 20:
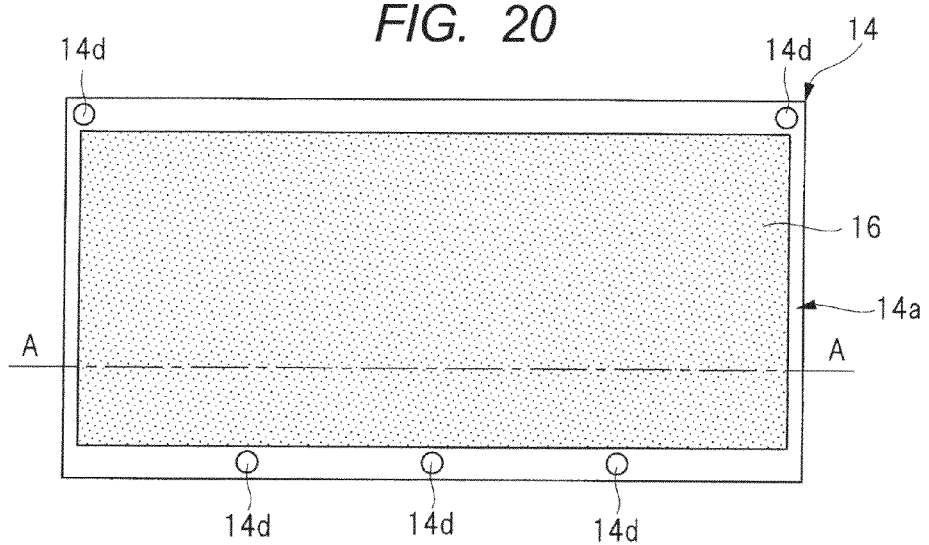
FIG. 20 is a plan view showing an example of the structure after molding in the post-process shown in FIG. 8.
Figure 21:
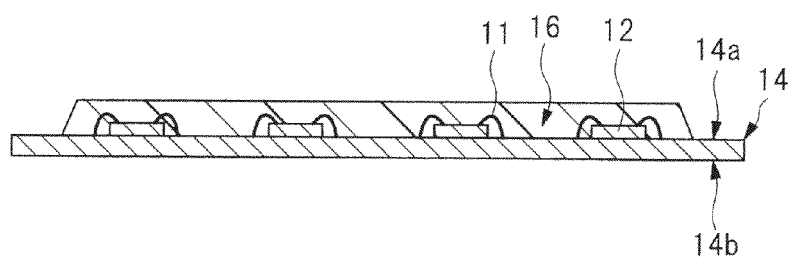
FIG. 21 is a sectional view showing an example of the structure cut along the line A-A of FIG. 20.
Figure 22:
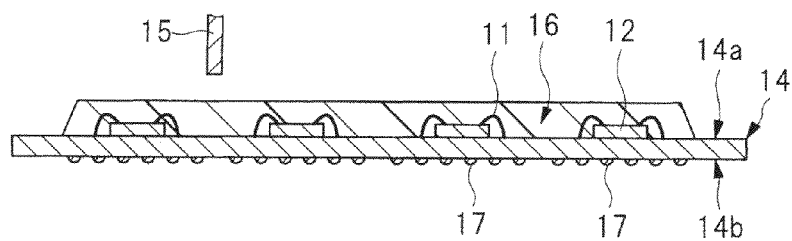
FIG. 22 is a sectional view showing an example of the structure at the time of ball affixing and substrate dicing in the post-process shown in FIG. 8.

FIGS. 17 to 22 show a method for manufacturing a semiconductor device (BGA). FIG. 17 is a plan view showing an example of the structure of a substrate used in the post-process shown in FIG. 8, FIG. 18 is a plan view showing an example of the structure after chip die bonding in the post-process shown in FIG. 8, FIG. 19 is a plan view showing an example of the structure after wire bonding in the post-process shown in FIG. 8, and FIG. 20 is a plan view showing an example of the structure after molding in the post-process shown in FIG. 8. Further, FIG. 21 is a sectional view showing an example of the structure cut along the line A-A of FIG. 20, and FIG. 22 is a sectional view showing an example of the structure at the time of ball affixing and substrate dicing in the post-process shown in FIG. 8.

<Pad Opening> "Pad opening" shown in the step S1 of FIG. 7 is carried out. At this point, as shown in FIG. 9, a semiconductor wafer having a plurality of chip areas (semiconductor chips) with a plurality of electrode pads 12b is provided, and a passivation film 12g which is an insulating film and a TiN layer 12q formed over the electrode pad 12b in each chip area in this wafer state are removed to form an opening 12j so that the electrode pad 12b made of a material containing Al as the main component is exposed to the opening 12j. A Ti/TiN/Ti film 12i is formed below the electrode pad 12b. At this point, the passivation film 12g is removed by, for example, sputter etching (technology for removing a material by causing gas ions having an etching function to collide with the surface of the material).

<Probe Testing (P Testing)> After the above pad opening, "W testing P testing" (probe testing) shown in the step S2 of FIG. 7 is carried out. At this point, a probe needle (not shown) is brought into contact with the electrode pad 12b shown in FIG. 7 to carry out a conduction test. Stated more specifically, as shown in FIG. 3, the above probe needle is brought into contact with an area outside the wire bonding part 11a of the electrode pad 12b, whereby a plurality of probe marks 12k shown in FIG. 11 are formed.

Figure 11:
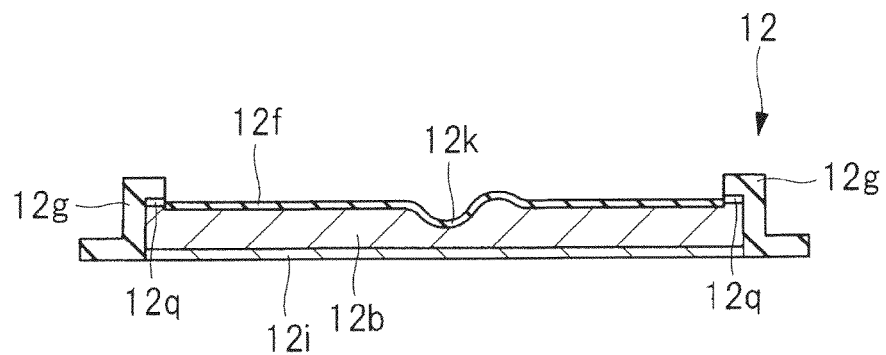
FIG. 11 is a sectional view showing an example of the structure after the probe testing of the pre-process shown in FIG. 7.
Figure 12:
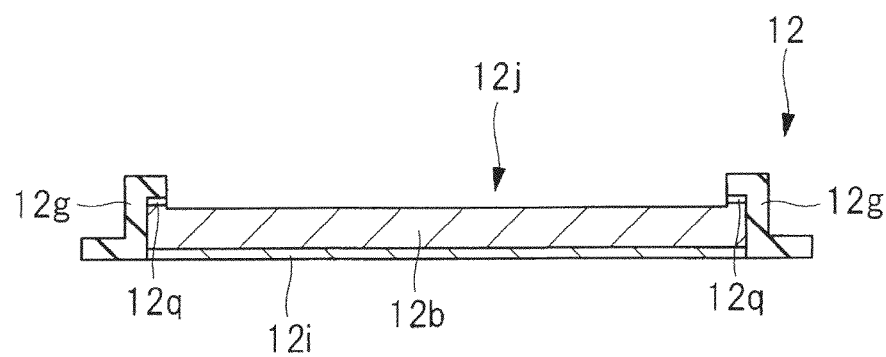
FIG. 12 is a sectional view showing an example of a natural oxide film removal state in the pre-process shown in FIG. 7.

After the above passivation film 12g is removed, along with the passage of time, as shown in FIG. 10 and FIG. 11, a natural oxide film 12f is formed on the surface (exposed surface, wire bonding surface) of the exposed electrode pad 12b. This natural oxide film 12f is made of, for example, $Al_2O_3$.

<Oxide Film Removal/Film Formation> After the above probe testing, "oxide film removal/film formation" shown in the step S3 of FIG. 7 is carried out.

As shown in FIG. 12, the natural oxide film 12f shown in FIG. 11 formed on the surface (exposed surface, wire bonding surface) of the electrode pad 12b is first removed, thereby exposing the Al electrode pad 12b.

At this point, in this embodiment, the natural oxide film 12f is removed in a vacuum atmosphere. For example, a sputtering apparatus is used to remove (sputter etch) this natural oxide film 12f in a vacuum atmosphere in the vacuum processing chamber (vacuum chamber) of this sputtering apparatus. In other words, the sputtering apparatus is used to etch the natural oxide film 12f.

After the natural oxide film 12f is removed, a first film (pad-cover film) 12d comprised of a conductive member shown in FIG. 13 is formed on the surface (exposed surface, wire bonding surface) of the electrode pad 12b exposed by removing the natural oxide film 12f.

At this point, it is preferred that, in the sputtering apparatus used to remove the natural oxide film 12f and while keeping the vacuum state, the first film 12d should be formed without contacting air after moving into a vacuum processing chamber for film formation.

That is, in the vacuum processing chambers of the sputtering apparatus, the removal of the natural oxide film 12f and the formation of the first film (sputtered film) are carried out continuously.

Thereby, it is possible to prevent the formation of an oxide film over the outermost surface of the electrode pad 12b made of Al.

Further, since the removal of the natural oxide film 12f and the formation of the first film 12d are carried out continuously so as to form the first film 12d over the surface (exposed surface, wire bonding surface) of the electrode pad 12b by sputtering in the same vacuum atmosphere, film formation processing can be carried out efficiently.

Herein, the first film (pad-cover film) 12d has a crystal structure comprised of a body-centered cubic lattice or a hexagonal close-packed lattice. Since Al (electrode pad 12b) and Cu (wire 11) are comprised of a face-centered cubic lattice, a crystal structure which has a large hardness difference from Al and Cu so that the crystal structure can be easily broken is a condition required for the first film 12d.

Therefore, the crystal structure of the first film 12d is comprised of a body-centered cubic lattice or a hexagonal close-packed lattice.

As an example, the first film 12d is made of chromium, tungsten or titanium.

In the structure shown in FIG. 13, the first film 12d is formed over the electrode pad 12b and also the passivation film 12g.

After the first film 12d is formed, as shown in FIG. 14, a photoresist film 12h is formed. That is, the photoresist film 12h is formed over the first film 12d over the area of the electrode pad 12b.

Then, as shown in FIG. 15, after the photoresist film 12h is formed, the first film 12d protruding outward from above the area of the electrode pad 12b as shown in FIG. 14 is removed by using the photoresist film 12h as a mask. At this point, for example, the sputtering apparatus is used to remove (sputter etch) the first film 12d. Further, after the protruding first film 12d is removed, the photoresist film 12h is removed to expose the first film 12d over the electrode pad 12b as shown in FIG. 16. The removal of the protruding first film 12d shown in FIG. 15 and the removal of the photoresist film 12h shown in FIG. 16 may be carried out by etching using an etching apparatus.

Thereby, the first film 12d is formed over each of the electrode pads 12b of each chip area (semiconductor chip 12) in the wafer.

<Backgrinding> After the above oxide film removal/film formation, backgrinding shown in the step S4 of FIG. 7 is carried out. That is, the rear surface of the wafer is ground to reduce the thickness of the wafer to a desired value. Thereafter, as shown in the step S5, the post-process comes next. That is, the assembly of the BGA 10 of FIG. 1 which is an example of the semiconductor device comes next.

<Dicing> In the assembly process (post-process) of the BGA 10 shown in FIG. 1, "dicing" shown in the step S11 of FIG. 8 is first carried out. That is, the wafer having a desired thickness formed by backgrinding in the step S5 of FIG. 7 is diced to be divided into individual semiconductor chips 12 (segmentation).

Meanwhile, a multipiece substrate 14 shown in FIG. 17 is provided to form the BGA 10. That is, the multipiece substrate 14 having a plurality of device areas 14c over the top surface 14a is provided. The device areas 14c are formed in a matrix, and a plurality of holes 14d are formed in the peripheral part of the substrate. The holes 14d are used for the positioning of the multipiece substrate 14.

The BGA 10 of this embodiment is a semiconductor device which is assembled by using the multipiece substrate 14. At this point, as for a sealing step (molding step) for the assembly of this embodiment, a case where resin sealing is carried out by so-called "batch molding system" in which a resin is supplied into a cavity while the semiconductor chips 12 mounted in the device areas 14c are covered by the single cavity (not shown) will be explained. The above molding system is not limited to the batch molding system.

<Chip Die Bonding> After the above dicing, "chip die bonding" shown in the step S12 of FIG. 8 is carried out. That is, as shown in FIG. 18, the semiconductor chips 12 are mounted in the respective device areas 14c of the multipiece substrate 14. Thereby, the semiconductor chips 12 are mounted over the top surface 14a of the multipiece substrate 14.

The semiconductor chips 12 are fixed to the substrate by the die bonding material 18 as shown in FIG. 1.

<Wire Bonding> After the above chip die bonding, "wire bonding" shown in the step S13 of FIG. 8 is carried out. At this point, as shown in FIG. 19, the electrode pads (see FIG. 1) 12b of the semiconductor chips 12 and the bonding leads (see FIG. 1) 20c corresponding to these are electrically connected with each other by bonding wires 11, respectively.

The wires 11 are, for example, Cu wires.

In the wire bonding of this embodiment, as shown in FIG. 2, the wire 11 is connected with the first film 12d over the electrode pad 12b of the semiconductor chip 12, and part of the wire 11 is brought into contact with the electrode pad 12b to form the alloy layer 12e at the interface between the wire 11 and the electrode pad 12b.

Further, at the time of wire bonding, the first film 12d is broken by the wire 11, whereby the pure Al electrode pad 12b and the Cu wire (wire 11) are electrically connected with each other.

Therefore, broken pieces 12m of the first film 12d remain around the interface between the electrode pad 12b and the wire bonding part 11a.

As described above, the Al electrode pad 12b and the wire 11 are connected with each other by breaking (destroying) the first film 12d with the wire 11 in the wire bonding of this embodiment, thereby making it possible to form the alloy layer 12e made of Cu and Al at the interface between the wire 11 and the electrode pad 12b.

Thereby, the bonding strength of the Cu wire (wire 11) can be ensured with the result that the bonding reliability of wire bonding of the BGA 10 can be ensured.

The first film 12d is preferably broken by the wire 11 but not always need to be broken, and the wire 11 and the electrode pad 12b may not be electrically connected with each other through the first film 12d. When the wire 11 and the electrode pad 12b are connected with each other through the first film 12d, high bonding reliability can be obtained as compared with a case where the wire 11 and the electrode pad 12b are connected with each other through an oxide film.

<Molding> After wire bonding, "molding" shown in the step S14 of FIG. 8 is carried out. Molding in this embodiment is batch molding as described above.

Thereby, as shown in FIG. 20, a batch sealing part 16 is formed over the top surface 14a of the multipiece substrate 14, and as shown in FIG. 21, the semiconductor chips 12 are sealed with the batch sealing part 16.

<Ball Affixing> After molding, "ball affixing" shown in the step S15 of FIG. 8 is carried out. That is, as shown in FIG. 22, a plurality of solder bumps (solder balls) 17 are formed as external connection terminals over the under surface 14b of the multipiece substrate 14.

Lead-free solder is preferably used as a solder material used for the solder bumps 17. By employing lead-free solder, environmental load can be reduced. Herein, the term "lead-free solder" means solder having a lead (Pb) content of 0.1 wt % or less, and this content is defined as the standard of the RoHS (Restriction of Hazardous Substances) Directive.

<Marking> After ball affixing, "marking" shown in the step S16 of FIG. 8 is carried out. For example, a predetermined production number or management number is marked by applying a laser beam to the top part of the batch sealing part 16.

<Substrate Dicing> After marking, "substrate dicing" shown in the step S17 of FIG. 8 is carried out. That is, the batch sealing part 16 and the multipiece substrate 14 shown in FIG. 22 are diced for each device area unit by a dicing blade 15 to be divided.

Thereby, they are divided into the BGA's 10 shown in FIG. 1.

<Testing> After substrate dicing, "testing" shown in the step S18 of FIG. 8 is carried out. That is, a test such as an operation test is carried out on the separated BGA's 10. Thereby, non-defective products are selected.

<Appearance> After testing, "appearance" shown in the step S19 of FIG. 8 is carried out. That is, the appearance of the BGA 10 selected by testing is inspected, thereby completing the assembly of the BGA 10 shown in FIG. 1.

In the manufacturing method of the BGA 10 and the BGA 10 according to the embodiment, the first film 12d such as a chromium film is formed on the surface of the electrode pad 12b which is formed in the main surface 12a of the semiconductor chip 12 and from which the natural oxide film 12f has been removed and destroyed to bond the Cu wire (wire 11) to the electrode pad 12b.

At this point, the first film 12d such as a chromium or tungsten film has a large hardness difference from Al and Cu so that it is easily broken.

Therefore, since the wire 11 is bonded to the pure Al surface of the electrode pad 12b, the bonding part between the wire 11 and the electrode pad 12b can be stabilized.

As a result, the bonding reliability of wire bonding of the BGA 10 can be ensured.

Further, by bonding the wire 11 to the pure Al surface of the electrode pad 12b, electric resistance can be reduced, thereby making it possible to improve the electrical properties of the wire bonding part 11a.

By using the wire 11 such as a Cu wire except for a gold wire, the cost of the BGA 10 can be reduced. That is, the cost of the BGA 10 can be reduced while the bonding reliability of wire bonding of the BGA 10 is ensured.

<Modifications> While the invention made by the inventors of the present invention has been described in detail based on the embodiment, it is to be understood that the invention is not limited to the embodiment which has been described above and that various modifications may be made in the invention without departing from the spirit and scope thereof.

Figure 23:
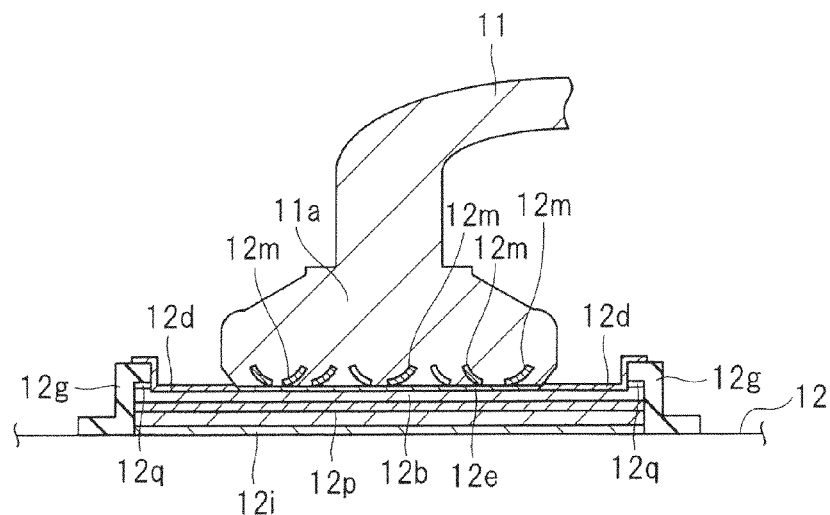
FIG. 23 is a partially enlarged sectional view showing the structure of the wiring bonding part of Modification 1 of the embodiment.
Figure 24:
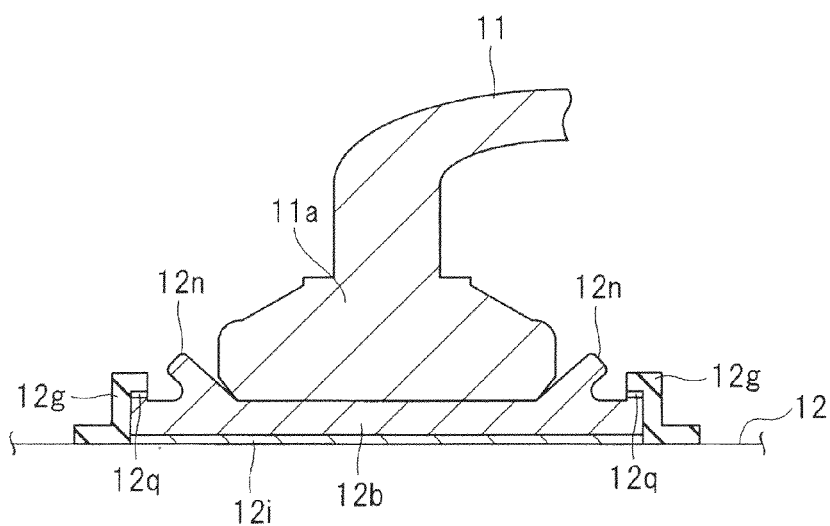
FIG. 24 is a partially enlarged sectional view showing the structure of the wire bonding part of Comparative Example.

(Modification 1) FIG. 23 is a partially enlarged sectional view showing the structure of the wire bonding part of Modification 1 of the embodiment, and FIG. 24 is a partially enlarged sectional view showing the structure of the wire bonding part of Comparative Example.

FIG. 24 shows the structure which was compared and investigated by the inventors of the present application. In Modification 1, a measure for a semiconductor chip 12 which requires thick Al electrode pads 12b in consideration of electric properties will be explained. In the semiconductor chip 12 having thick Al electrode pads 12b, a pad splash 12n (embossment of the electrode pad 12b) tends to be formed around the wire bonding part 11a of the electrode pad 12b.

The pad splash 12n tends to become large in the case of the thick electrode pad 12b. However, when the thickness of the electrode pad 12b is reduced, the thickness of the pad below the wire bonding part 11a becomes small. Accordingly, base damage may occur. Therefore, it is difficult to increase bonding load at the time of wire bonding.

Then, as shown in FIG. 23, an intermediate film (second film) having high hardness is formed in the thickness direction of the electrode pad 12b. The intermediate film 12p does not need to be located at an intermediate position in the thickness direction of the electrode pad 12b and may be formed on an upper layer side or a lower layer side in the thickness direction of the electrode pad 12b.

The intermediate film 12p is comprised of a conductive member. When the intermediate film 12p is formed in the electrode pad 12b, the stiffness of the electrode pad 12b can be strengthened. Also, the pad splash 12n can be suppressed. Further, damage to the substrate can be reduced.

Figure 25:
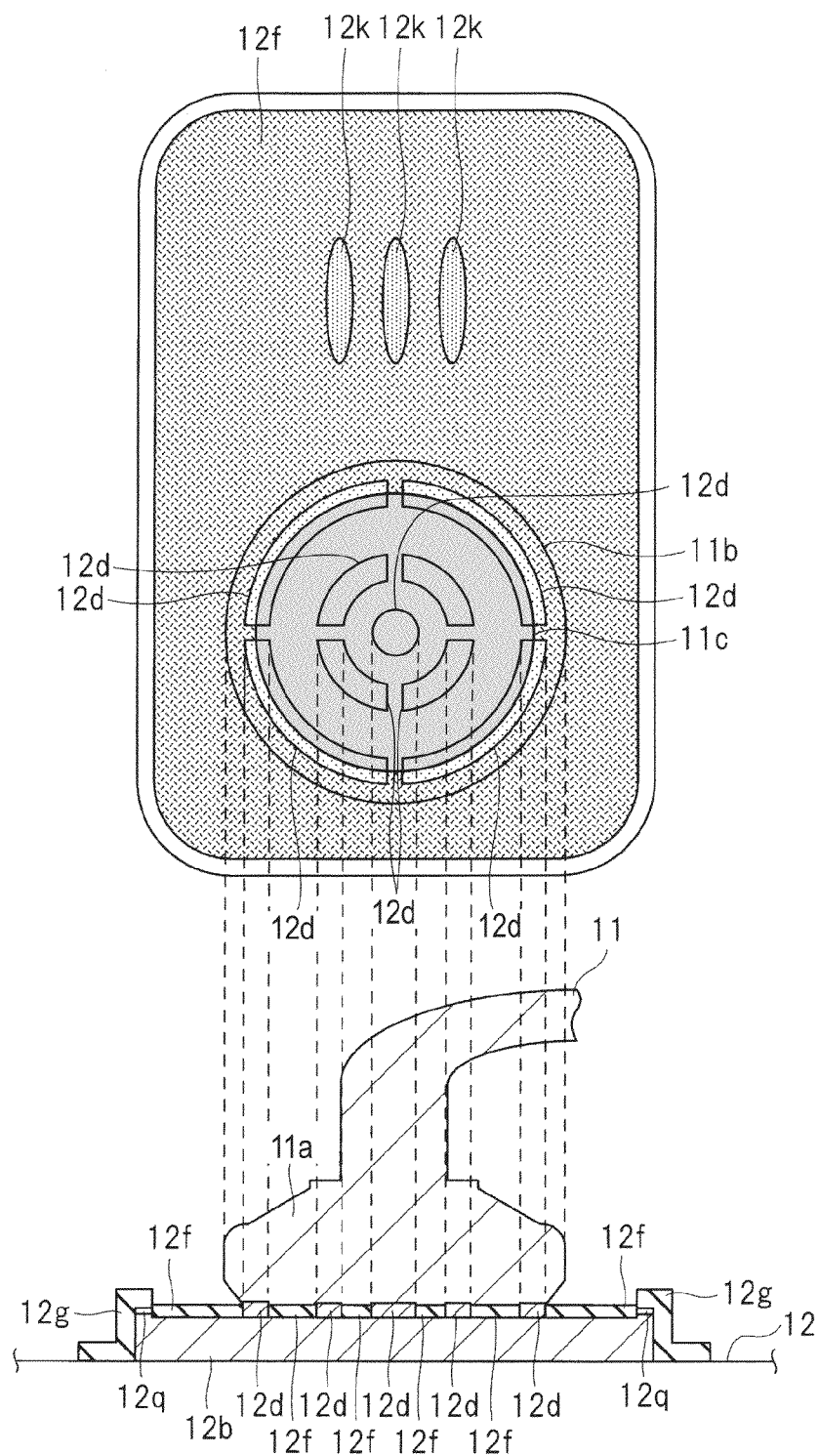
FIG. 25 includes a plan view and a partial sectional view showing the structure of the wire bonding part of Modification 2 of the embodiment.
Figure 26:
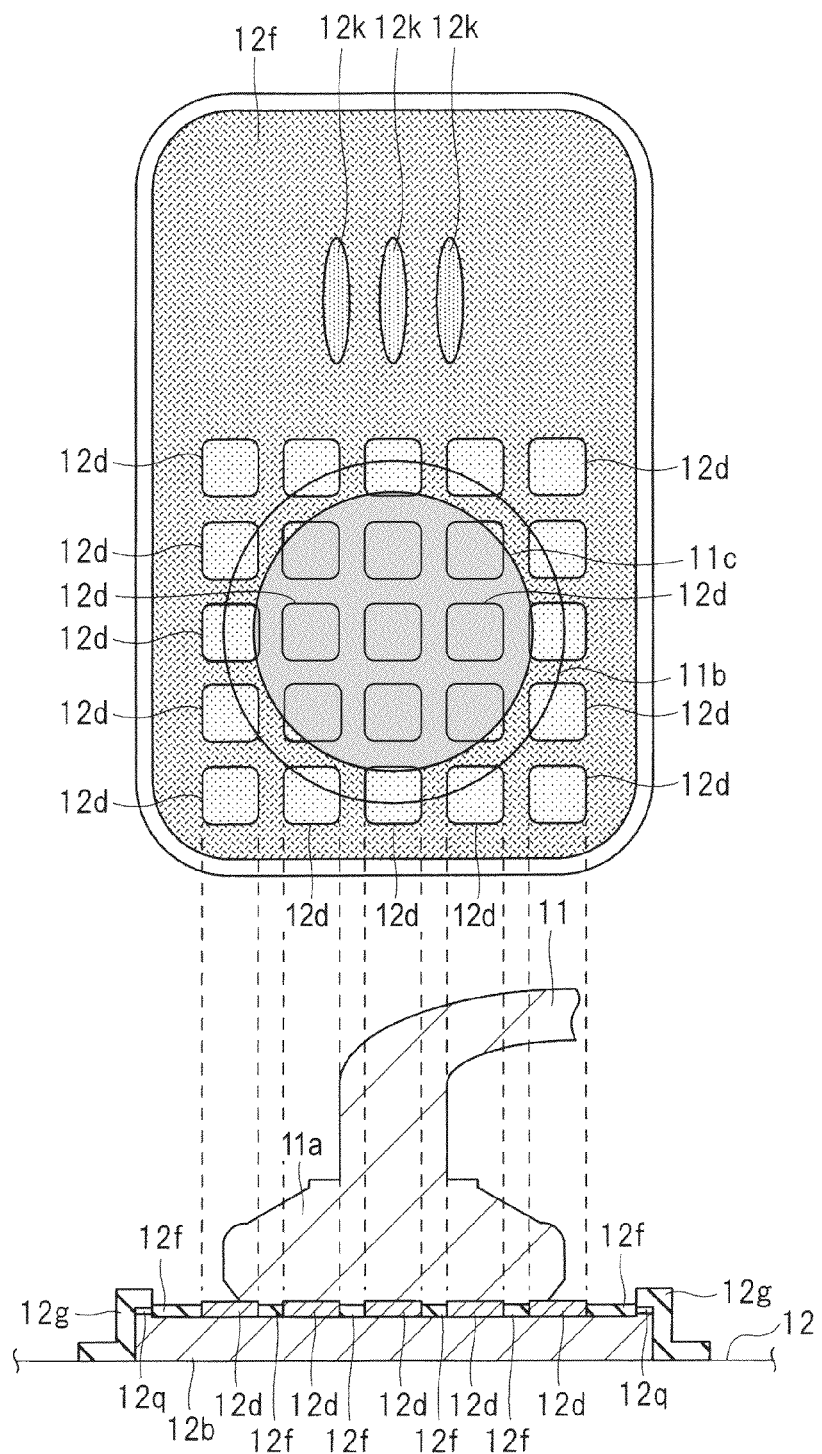
FIG. 26 includes a plan view and a partial sectional view showing the structure of the wire bonding part of Modification 2 of the embodiment.

(Modification 2) In the above embodiment, the first film 12d is formed over the entire surface of the electrode pad 12b as shown in FIG. 3. As shown in FIGS. 25 and 26, the first film 12d may be formed only in an area where the wire 11 is to be bonded (area where the wire bonding part 11a is to be bonded).

FIGS. 25 and 26 are plan views and partial sectional views showing the structure of the wire bonding part of Modification 2 of the embodiment.

As for the structure shown in FIG. 25, the first films 12d are ring-shaped. A plurality of (for example, two) the ring-shaped first films 12d having different ring diameters are formed concentrically. At this point, the ring-shaped first films 12d are not connected with each other and each divided into, for example, four.

That is, the separate first films 12d, and the natural oxide films 12f arranged around the first films 12d are in contact with the wire bonding part 11a, whereby the separate first films 12d are easily broken as the number of the interfaces of the first films 12d at the respective ends increases.

Further, the ring-shaped first films 12d and the natural oxide films are divided according to a load distribution since they differ in the amount of applied load according to the distance from right below a capillary (not shown) as a bonding tool. Therefore, as compared with a case where the natural oxide film 12f is formed, the bonding properties of the wire 11 can be enhanced.

As for the structure shown in FIG. 26, the first film 12d is divided into a plurality of small squares in the plan view. Also in this case, the divided first films 12d and the natural oxide films 12f arranged around the first films 12d are in contact with the wire bonding part 11a. Like the structure shown in FIG. 25, the divided first films 12d are easily broken since the number of the interfaces of the first films 12d at the respective ends increases.

That is, by dividing the pattern of the first film 12d in contact with the wire bonding part 11a, the divided first films 12d and the natural oxide films 12f around the first films 12d come in contact with the wire bonding part 11a with the result that the number of the interfaces of the first films 12d at the ends (peripheries) increases. Thereby, the first films 12d can be easily broken.

(Modification 3) In the above embodiment, the first film (pad-cover film) 12d consists of a single layer. The first film 12d may consist of a plurality of layers. For example, it may have a two-layer structure consisting of an upper chromium layer and a lower copper layer, whereby the copper layer underlies the chromium layer, thereby making it possible to enhance its bonding force to the Cu wire (wire 11).

The first film 12d may consist of a mixed layer (single layer) made of chromium and copper. Further, it may be made of a compound (single layer) containing chromium.

(Modification 4) In the above embodiment, the electrode pad 12b of the semiconductor chip 12 is made of a material containing aluminum as the main component and the wire 11 is made of a material containing copper as the main component. The main component of the electrode pad 12b and the main component of the wire 11 may be any material other than the above materials except for gold (Au).

For example, they may be a combination of a wire 11 containing aluminum as the main component and an electrode pad 12b containing aluminum as the main component, or a combination of a wire 11 containing aluminum as the main component and an electrode pad 12b containing copper as the main component. Further, they may be a combination of a wire containing silver as the main component and an electrode pad 12b containing aluminum as the main component, a combination of a wire 11 containing silver as the main component and an electrode pad 12b containing copper as the main component, or a combination of a wire 11 containing copper as the main component and an electrode pad 12b containing copper as the main component.

Further, as a combination other than the above combinations, a combination of a wire 11 made of a material except for gold and an electrode pad 12b made of a material except for gold may be used.

(Modification 5) In the above embodiment, as a method for removing the natural oxide film 12f formed on the surface of the electrode pad 12b of the semiconductor chip 12, sputter etching using a sputtering apparatus is employed to remove the natural oxide film 12f. The removal of the natural oxide film 12f may be carried out by, for example, etching using an etching apparatus.

(Modification 6) In the above embodiment, after the natural oxide film 12f is removed, the first film 12d is formed on the surface (fresh surface) of the newly exposed electrode pad 12b by sputtering using a sputtering apparatus. The formation of the first film 12d may be carried out by, for example, plating.

(Modification 7) In the above embodiment, the semiconductor device is the BGA 10. The above semiconductor device may be a QFP (Quad Flat Package) which is assembled by using lead frames or a QFN (Quad Flat Non-leaded Package).

Figure 27:
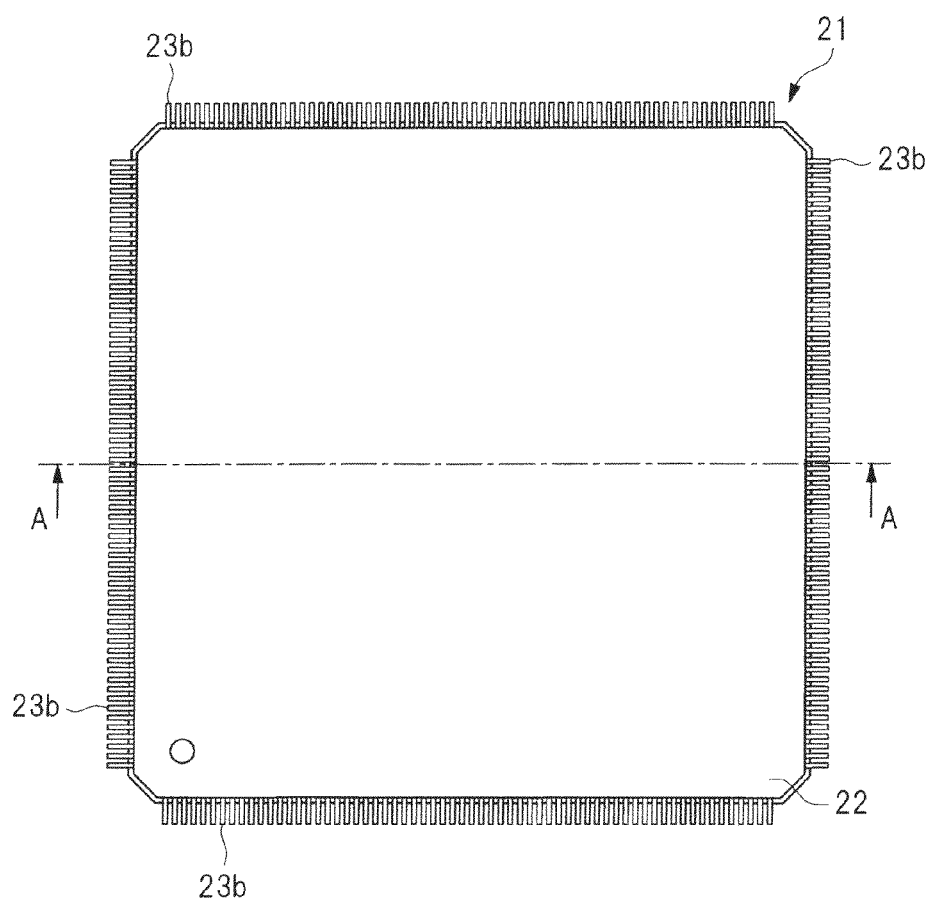
FIG. 27 is a plan view showing the structure of the semiconductor device of Modification 7 of the embodiment.
Figure 28:
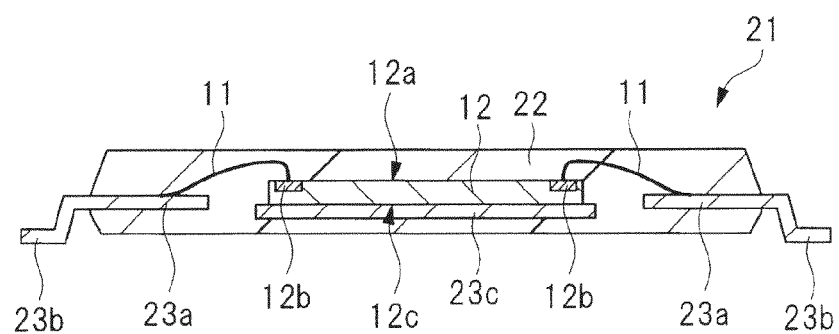
FIG. 28 is a sectional view showing the structure of the semiconductor device shown in FIG. 27.
Figure 29:
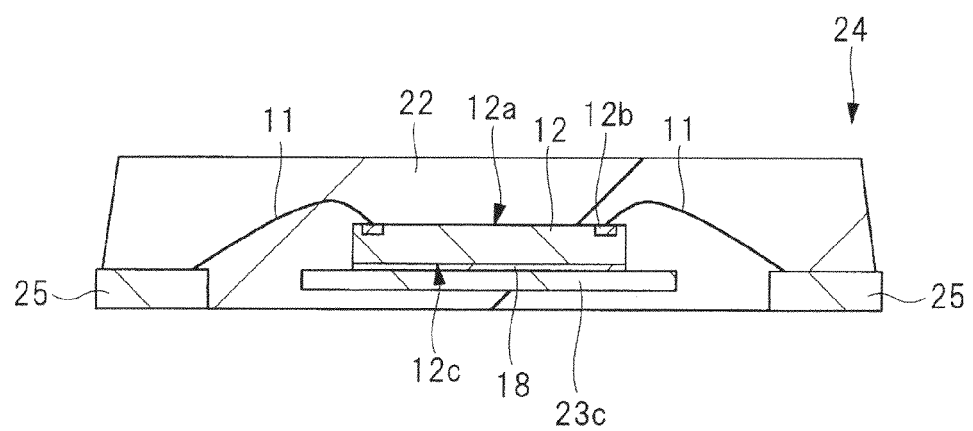
FIG. 29 is a sectional view showing the structure of the semiconductor device of Modification 7 of the embodiment.

FIG. 27 is a plan view showing the structure of the semiconductor device of Modification 7 of the embodiment, FIG. 28 is a sectional view showing the structure of the semiconductor device shown in FIG. 27, and FIG. 29 is a sectional view showing the structure of the semiconductor device of Modification 7 of the embodiment.

The semiconductor device shown in FIG. 27 and FIG. 28 is a so-called QFP 21 in which a plurality of outer parts 23b which will become external connection terminals project from the four sides of a sealing body 22 having a substantially square planar shape.

In the QFP 21, the semiconductor chip 12 is mounted over a tab 23c, and the electrode pads 12b of the semiconductor chip 12 and a plurality of inner parts 23a are electrically connected with each other by the wires 11. The semiconductor chip 12 and the wires 11 are resin sealed with the sealing body 22 made of a sealing resin.

Even in this QFP 21, the first film 12d is formed on the surface of the electrode pad 12b of the semiconductor chip 12 and broken at the time of wire bonding to connect the wire 11 with the electrode pad 12b, thereby making it possible to ensure the bonding reliability of wire bonding of the QFP 21.

Then, the semiconductor device shown in FIG. 29 is a so-called QFN 24 in which a plurality of leads 25 which will become external connection terminals are exposed to the rear surface of the sealing body 22 having a substantially square planar shape.

Also in the QFN 24, the semiconductor chip 12 is mounted over the tab 23c, and the electrode pads 12b of the semiconductor chip 12 and the leads 25 are electrically connected with each other by the wires 11. The semiconductor chip 12 and the wires 11 are resin sealed with the sealing body 22 made of a sealing resin.

Even in this QFN 24, the first film 12d is formed on the surface of the electrode pad 12b of the semiconductor chip 12 and broken at the time of wire bonding to connect the wire 11 with the electrode pad 12b, thereby making it possible to ensure the bonding reliability of wire bonding of the QFN 24.

(Modification 8) In the above embodiment, the solder bumps 17 are formed as the external connection terminals of the semiconductor device (BGA 10), and a solder material used for the solder bumps 17 is lead-free solder containing substantially no lead (Pb). The above solder material may be a solder material containing lead such as Sn-Pb-based solder. When an environmental contamination problem is taken into consideration, a solder material comprised of the above lead-free solder is preferably used.

(Modification 9) Further, a combination of the above modifications may be used without departing from the scope of the technical idea described in the above embodiment.

What is claimed is:

1. A manufacturing method of a semiconductor device, comprising the steps of:
   (a) providing a semiconductor chip including an electrode pad;
   (b) after the step (a), removing a natural oxide film formed on the surface of the electrode pad;
   (c) after the step (b), forming a pad-cover film, comprised of a conductive member, over the surface of the electrode pad exposed by removing the natural oxide film; and
   (d) after the step (c), connecting a part of wire, comprised of a conductive material containing no gold, to the pad-cover film, and forming an alloy layer at the interface between the wire and the electrode pad, wherein
   the crystal structure of the pad-cover film is comprised of one of a body-centered cubic lattice and a hexagonal close-packed lattice, and
   in the step (d), the pad-cover film is broken to connect the wire with the electrode pad.

2. The manufacturing method of a semiconductor device according to claim 1,
   wherein the pad-cover film is comprised of chromium, titanium or tungsten.

3. The manufacturing method of a semiconductor device according to claim 1,
   wherein in the step (b), the natural oxide film is removed in a vacuum atmosphere, and
   wherein in the step (c), the pad-cover film is formed in the vacuum atmosphere without making the vacuum atmosphere of the step (b) open to air.

4. The manufacturing method of a semiconductor device according to claim 3,
   wherein in the step (b), the natural oxide film is removed by sputter etching.

5. The manufacturing method of a semiconductor device according to claim 1,
   wherein in the step (c), the pad-cover film is formed over the entire surface of the electrode pad.

6. The manufacturing method of a semiconductor device according to claim 1, wherein the electrode pad is comprised of a material containing aluminum as the main component, and
wherein the wire is comprised of a material containing copper as the main component.

7. A semiconductor device comprising:
a semiconductor chip including:
   a main surface, and
   a plurality of electrode pads formed on the main surface;
a plurality of leads arranged around the semiconductor chip; and
a plurality of wires, comprised of a conductive material containing no gold, electrically connecting the electrode pads with the leads, respectively,
wherein a plurality of pad-cover films, comprised of a conductive member, are formed on surfaces the plurality of electrode pads, respectively,
wherein the plurality of wires are directly connected with the plurality of electrode pads through broken areas of the pad-cover films where the electrode pads are exposed such that alloy layers are formed at the interfaces between the plurality of wires and the plurality of electrode pads, respectively, and
wherein the crystal structure of each of the pad-cover films is comprised of one of a body-centered cubic lattice and a hexagonal close-packed lattice.

8. The semiconductor device according to claim 7,
wherein the pad-cover film is comprised of chromium, titanium or tungsten.

9. The semiconductor device according to claim 7,
wherein the electrode pad is comprised of aluminum and the wire is comprised of a material containing copper as the main component.

* * * * *